United States Patent
Nakamura et al.

(10) Patent No.: US 7,825,006 B2
(45) Date of Patent: Nov. 2, 2010

(54) LIFT-OFF PROCESS FOR GAN FILMS FORMED ON SIC SUBSTRATES AND DEVICES FABRICATED USING THE METHOD

(75) Inventors: Shuji Nakamura, Santa Barbara, CA (US); Steven DenBaars, Goleta, CA (US)

(73) Assignee: Cree, Inc., Goleta, CA (US)

( * ) Notice: Subject to any disclaimer, the term of this patent is extended or adjusted under 35 U.S.C. 154(b) by 926 days.

(21) Appl. No.: 10/841,016

(22) Filed: May 6, 2004

(65) Prior Publication Data

US 2005/0247950 A1   Nov. 10, 2005

(51) Int. Cl.
  *H01L 21/30*   (2006.01)
  *H01L 21/00*   (2006.01)
(52) U.S. Cl. .................................. 438/458; 438/26
(58) Field of Classification Search .................. 438/22, 438/25, 26, 31, 36, 458; 257/E21.06, E21.061, 257/E33.023, E33.026, E33.028, E33.031, 257/E33.035, E33.067
See application file for complete search history.

(56) References Cited

U.S. PATENT DOCUMENTS

| | | | | |
|---|---|---|---|---|
| 6,033,995 A | * | 3/2000 | Muller | 438/749 |
| 6,071,795 A | | 6/2000 | Cheung et al. | 438/458 |
| 6,320,206 B1 | | 11/2001 | Coman et al. | 257/94 |
| 6,455,340 B1 | | 9/2002 | Chua et al. | 438/31 |
| 2003/0180980 A1 | | 9/2003 | Margalith et al. | |
| 2004/0033638 A1 | * | 2/2004 | Bader et al. | 438/46 |
| 2005/0170611 A1 | * | 8/2005 | Ghyselen et al. | 438/458 |

FOREIGN PATENT DOCUMENTS

WO   WO 0048278   8/2000

OTHER PUBLICATIONS

E. Fred Schubert, *Light-Emitting Diodes*, (2003) Cambridge University Press, pp. 198-211.
Communication regarding related European Application No. 05 728 975.3-1235, Dated: Oct. 21, 2009.

* cited by examiner

*Primary Examiner*—Hung Vu
(74) *Attorney, Agent, or Firm*—Koppel, Patrick, Heybl & Dawson

(57) ABSTRACT

One embodiment of a method according to the present invention for fabricating a high light extraction photonic device comprises growing a lift-off layer on a substrate and growing an epitaxial semiconductor device structure on the lift-off layer such that the lift-off layer is sandwiched between said device structure and substrate. The epitaxial semiconductor structure comprises an emitter adapted to emit light in response to a bias. The device structure, lift-off layer and substrate is flip-chip mounted on a submount such that the epitaxial semiconductor device structure is sandwiched between the submount and lift-off layer. The lift-off layer is removed to separate the substrate from the device structure. Different removal methods can be used such as removal by a photo electrochemical etch or by illuminating the lift-off layer with laser light.

16 Claims, 8 Drawing Sheets

LIFT-OFF PROCESS FOR GAN FILMS FORMED ON SIC SUBSTRATES AND DEVICES FABRICATED USING THE METHOD

BACKGROUND OF THE INVENTION

1. Field of the Invention

This invention relates to a method for fabricating a semiconductor device, and more particularly to a method for fabricating thin film semiconductor devices.

2. Description of the Related Art

Improvements in the manufacturing of semiconductor materials in the Group-III nitride material system has focused interest on the development of GaN/AlGaN opto-electronic devices such as high efficiency blue, green and ultra-violet (UV) light emitting diodes (LED or LEDs) and lasers, and electronic devices such as high power microwave transistors. Some of the advantages of GaN is its 3.4 eV wide direct bandgap, high electron velocity ($2\times10^7$ cm/s), high breakdown field ($2\times10^6$ V/cm) and the availability of heterostructures.

Typical LEDs can comprise an active region sandwiched between a p-type doped layer and an n-type doped layer such that when a bias is applied across the doped layer electrons and holes are injected into the active region. The electrons and holes recombine in the active region to generate light omnidirectionally in an "emission sphere" with light radiating in all directions within the material that makes up the LED structure. Typical LEDs are efficient at generating light from the active region, but the light has difficulties emitting from the LED to the surroundings because of the differences in the indexes of refraction between the LED material and surroundings. In an LED having layers and regions of a typical thickness, only the photons formed in a cone about 20° wide in the direction of a surface exit the structure. The remainder of the light is trapped within the structure of the LED, and will eventually become absorbed into the semiconductor material. The light that is absorbed back into the LED material is lost to light generation, which reduces the overall emitting efficiency of the LED.

Different methods have been developed for improving the light emitting efficiency of typical LEDs, some of which include using non-planar shaped LEDs and roughening the emission surface of an LED. Both of these approaches improve emitting efficiency by providing an LED surface that has different angles such that when light from the LED's active region reaches the surface with varying angles between the light and the surface. This increases the possibility that the light will be within the 20° cone when it reaches the surface such that it emits from the LED. If it is not within the 20° angle, the light is reflected at different angles, increasing the likelihood that the light will be within the cone the next time it reaches the surface.

Emission efficiency is also enhanced by utilizing a resonant cavity structure in a resonant cavity LED (RCLED). RCLEDs are generally described in E. Fred Shubert, *Light Emitting Diodes*, Cambidge University Press, Pages 198-211 (2003). RCLEDs typically comprise two oppositely doped epitaxial layers and mirrors on the oppositely doped layers such that the oppositely doped layers are sandwiched between the mirrors. One of the mirrors has reflectivity that is lower than the reflectivity of the other mirror so that light exits the RCLED through the lower reflectivity mirror. In other embodiments, an epitaxial active region can be included between the oppositely doped layers.

RCLEDs typically comprise epitaxial layers that are much thinner than standard LEDs and a resonant cavity effect appears when the thickness of the epitaxial layers is approximately one wavelength of the light generated by the epitaxial layers. The light generated in the resonant cavity forms a standing wave such that all light emitted is emitted directionally. This directional light emission releases the photons in directions that are substantially normal to a plane formed by the diode junction and at a higher intensity compared to standard LEDs. The emission spectrum of RCLEDs has a higher spectral purity and the emission far-field pattern of RCLEDs is more directed compared to standard LEDs.

When fabricating RCLEDs of certain material systems there are challenges in depositing the two mirrors on opposite sides of epitaxial layers. The oppositely doped layers (and active region) are typically formed on a substrate using known fabrication methods and devices, such as epitaxial growth in a metalorganic chemical vapor deposition (MOCVD) reactor. Once these layers have been deposited on the substrate the first of the two mirrors may be deposited on to the most recently grown (top) epitaxial surface, which is usually the p-type doped layer. Placing a mirror surface on the surface of the other doped, first grown layer is not so easy, because the surface is in contact with the growth surface of the substrate. The layers of RCLEDs are typically thin so it can be difficult to separate the substrate from the epitaxial layers so that the second mirror can be deposited. It may not be practical to deposit the mirror on the substrate and then grow the epitaxial layer because of the crystal lattice mismatch between the mirror material and epitaxial layers.

One of the ways to deposit the second mirror on the epitaxial layers is to first remove the substrate. One technique for removing the substrate from epitaxial layers is described in U.S. Pat. No. 6,071,795 to W. Cheung et al. Thin films of GaN are epitaxially grown on a sapphire substrate and the substrate is then laser irradiated with a scanned beam at a wavelength at which sapphire is transparent but the GaN is absorbing (e.g. 248 mn wavelength). The intensity of the radiation, however, is low enough not to cause the irradiated area to separate. The separation process is performed after completion of the laser irradiation, such as by heating the structure to above the melting point of gallium. Another embodiment of the invention is described as growing a sacrificial material between the desired film and the growth substrate. The optical beam can then irradiate from the side of either the growth or acceptor substrate that is transparent to the optical beam.

The difficulty with this approach is that it is particularly adapted to semiconductor devices grown on sapphire substrates. Group-III nitride devices are often grown on silicon carbide substrates and if the wavelength of the irradiating optical beam is high enough not to be absorbed by the silicon carbide, the wavelength can be too high to be absorbed by the GaN. One alternative to this is to find a wavelength of light that is transparent to silicon carbide that will excite GaN. The difference in bandgap between GaN and silicon carbide, however, is too narrow to allow reliable transmission through the silicon carbide while being absorbed by the GaN.

SUMMARY OF THE INVENTION

One embodiment of a method according to the present invention for fabricating a high light extraction photonic device comprises growing a lift-off layer on a substrate and growing an epitaxial semiconductor device structure on the lift-off layer such that the lift-off layer is sandwiched between said device structure and substrate. The epitaxial semiconductor structure comprises an emitter adapted to emit light in response to a bias. The device structure, lift-off layer and substrate is flip-chip mounted on a submount such that the epitaxial semiconductor device structure is sandwiched between the submount and lift-off layer. The lift-off layer is removed to separate the substrate from the device structure.

Another embodiment of a method according to the present invention for fabricating a high light extraction photonic device comprises growing a lift-off layer on a substrate and growing an epitaxial semiconductor structure on the lift-off layer with the lift-off layer sandwiched between the epitaxial semiconductor structure and the substrate. A first mirror layer is deposited on the epitaxial semiconductor structure such that the epitaxial semiconductor structure is sandwiched between the first mirror layer and the lift-off layer. The substrate is separated from the epitaxial structure by removing the lift-off layer. A second mirror layer is deposited on the epitaxial semiconductor structure such that the epitaxial semiconductor structure is sandwiched between the first and second mirror layers.

One embodiment of a resonant cavity light emitting diode (RCLED) according to the present invention comprises a thin film epitaxial semiconductor structure, with a fist mirror layer on one surface of the epitaxial semiconductor structure. A second mirror layer is included on another surface of the epitaxial semiconductor structure such that the epitaxial semiconductor structure is sandwiched between the first and second mirrors. The second mirror layer has less reflectivity than the first mirror layer. A submount is included with the epitaxial semiconductor structure, and its first and second mirrors mounted on the submount. The first mirror layer is adjacent to the submount and the second mirror layer is the primary emitting surface.

These and other features and advantages of the invention will be apparent to those skilled in the art from the following detailed description, taken together with the accompanying drawings, in which:

DETAILED DESCRIPTION OF THE INVENTION

Figure 1:
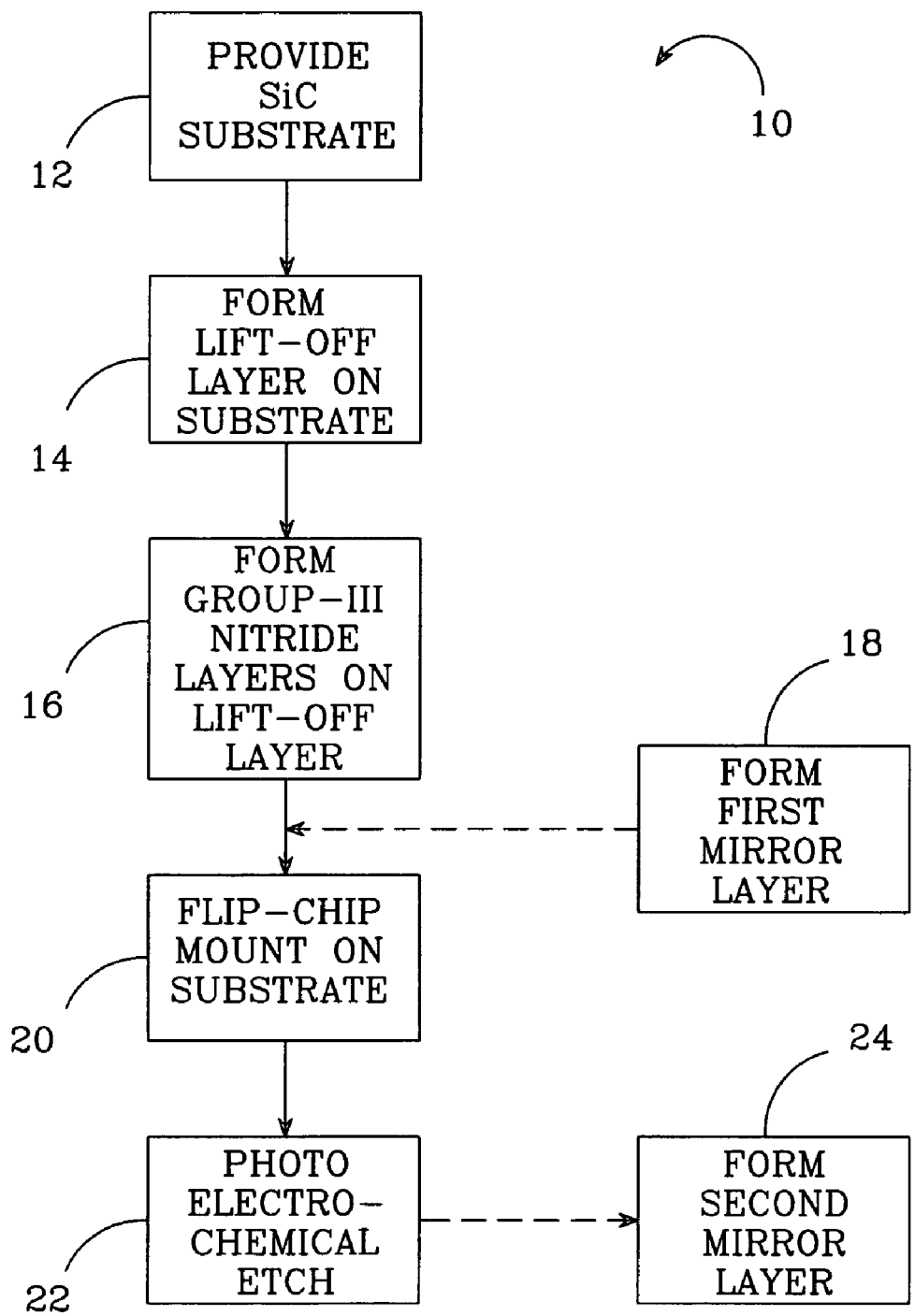
FIG. 1 is a flow diagram for one embodiment of a fabrication method according to the present invention.

FIG. 1 shows one embodiment of a method 10 according to the present invention for fabricating Group-III nitride semiconductors, with the method 10 being particularly adapted for fabricating thin film Group-III nitride semiconductor devices formed on a silicon carbide (SiC) substrate. In step 12, a SiC substrate is provided, which is a suitable material for use with Group-III nitride materials, such as GaN. SiC has a closer crystal lattice match to Group III nitrides GaN, which generally results in Group III nitride films of high quality. SiC also has high thermal conductivity so that the total output power of Group III nitride devices on SiC is not limited by the thermal dissipation of the substrate (as is the case with some devices formed on sapphire). SiC substrates are available from Cree Research, Inc., of Durham, N.C. and methods for producing them are set forth in the scientific literature as well as in U.S. Pat. Nos. Re. 34,861; 4,946,547; and 5,200,022.

In step 14, a lift-off layer is grown on at least one surface of the SiC substrate, with a preferred lift-off layer comprising a material having a smaller band gap material than the substrate or epitaxial layers so that the lift-off layer can be etched selectively by photo electrochemical etch. The lift off layer can comprise many different materials including but not limited to indium gallium nitride (InGaN), aluminum indium gallium nitride (AlInGaN) alloy and aluminum indium gallium arsenide (AlInGaAs) alloy, or other materials that reach with a photo electrochemical etch as described below. The lift-off layer can be grown by using any of the known semiconductor fabrication processes such as molecular beam epitaxy (MBE) or metal organic chemical vapor deposition (MOCVD).

In step 16 Group-III nitride epitaxial layer(s) are grown on the substrate such that the lift-off layer of InGaN is sandwiched between the SiC substrate and the epitaxial layers. The epitaxial layers can also be grown using any of the known semiconductor fabrication processes such as MBE or metal organic chemical vapor deposition MOCVD, and in one device formed by the method 10 the epitaxial layers can comprise thin films of p-type GaN and n-type GaN.

Depending on the type of device being fabricated, an optional step 18 is included that comprises depositing a first mirror layer on the surface of the epitaxial layers opposite the substrate. As will be understood by the discussion below, if a light emitting diode (LED) is being fabricated, this mirror helps increase the useful light extraction of the LED, and if an RCLED is being fabricated this mirror is necessary to generate the resonant cavity effect. Different mirrors can be used, such as metal mirrors made of materials such as silver, gold, rhodium, platinum, palladium, gold tin or combinations thereof, which can be deposited on the surface using conventional methods, such as sputtering. Alternatively, the mirror can be a distributed Bragg reflector (DBR) which generally comprises multiple pairs of two materials having different refractive indexes. As a result of the difference in the refractive index, Fresnel reflection occurs at each of the interfaces. The reflection at each may not be total, but because of the number of interfaces and the thicknesses of the different layers, the reflected waves constructively interfere so that the DBR provides good reflectivity. Depending on the type of material used for the DBR, it can be deposited on the top surface using the same method used to fabricate the epitaxial layer(s), usually MBE or MOCVD.

In step 20, the substrate, with its epitaxial layer(s) (and first mirror layer), is flip-chip mounted to a submount such that the top surface of the epitaxial layers, or the mirror, as the case may be, is adjacent to the submount. The surface of the epitaxial layer(s) or mirror layer can be bonded to the substrate using many known materials, one example being silver tin eutectic. The submount can be one of a single construction or can include a number of different structural members, and can be made of different materials such as silicon, silicon carbide, sapphire, glass or metals. The submount can also include electronic components to drive the device that comprises the epitaxial layer(s).

In step 22, the semiconductor device, or the lift-off layer, is exposed to a photo electrochemical etch (PEC) that etches the lift off layer without substantially etching the epitaxial layer(s). In one embodiment according to the present invention, the PEC etching comprises immersing the semiconductor device in a solution and illuminating the solution with light, the composition of the solution and the wavelength of light causing the lift off layer to be etched without etching the epitaxial layers. A preferred solution comprises (1:3) KOH and water, which alone does not substantially etch the lift-off layer or the Group-III nitride epitaxial layers. If, however, the solution is illuminated by a light the solution can etch the lift off layer and not the epitaxial layers. Different wavelengths of light can be used, with a suitable wavelength being approximately 400 nanometers (nm). It is believed that the 400 nm light causes the material in the lift-off layer to form electron hole pairs and the hole position which is on the In atom permits the bonding of a hydroxide ion. This forms $In_2O_3$ with a $H_2$ gas by product and the removal of the In begins to quickly unravel the lift-off layer structure. To further enhance the etching of the InGaN lift-off layer, the KOH and water solution can be biased by placing a probe on the substrate and another in the solution. After the lift-off layer is PEC etched, the submount with its epitaxial layers can be separated from the SiC substrate.

Depending on the device being fabricated, alternate step 24 can be included wherein a second mirror can be deposited on the surface of the epitaxial layer(s) that is revealed by separating the SiC substrate from the epitaxial layer(s). This step is usually included in combination with forming the first mirror layer such that the epitaxial layer(s) are sandwiched between the first and second mirror layers. This arrangement can be used when fabricating a resonant cavity LED (RCLED), solid state laser, or vertical-cavity surface-emitting laser (VCSEL).

The method 10 can be used in fabricating many different semiconductor devices having epitaxial layers made of many different materials with many different thicknesses. The method 10 is particularly adapted to growing high quality thin film Group-III nitride layers used in RCLEDs, with mirrors on the opposing sides of the thin films. When forming a Group-III nitride RCLED it is impractical to provide a mirror on the interface between the SiC substrate and the epitaxial layers because mirrors either have no recognizable monocrystalline structure or they are monocrystalline with a significantly different sized crystal lattice than that formed by epitaxial layers. As a result, it is difficult to fabricate high quality thin Group-III nitride layers on a mirror surface because of the mismatch in crystal structures.

SiC substrates, on the other hand, have a good crystal lattice match to Group III nitrides which generally results in thin Group III nitride layers of high quality. The thin epitaxial layers can require support during processing steps that follow growth on the substrate, and the method 10 allows for the first mirror to be deposited on the one surface of the epitaxial layers while the substrate is in place and supports the thin layers. The device is then flip chipped on a submount with the first mirror between the submount and layers. The submount provides additional support while the substrate is etched off and the second mirror is deposited. By providing this support through processing, high quality thin film devices can be fabricated in the Group-III nitride material system.

Figure 2:
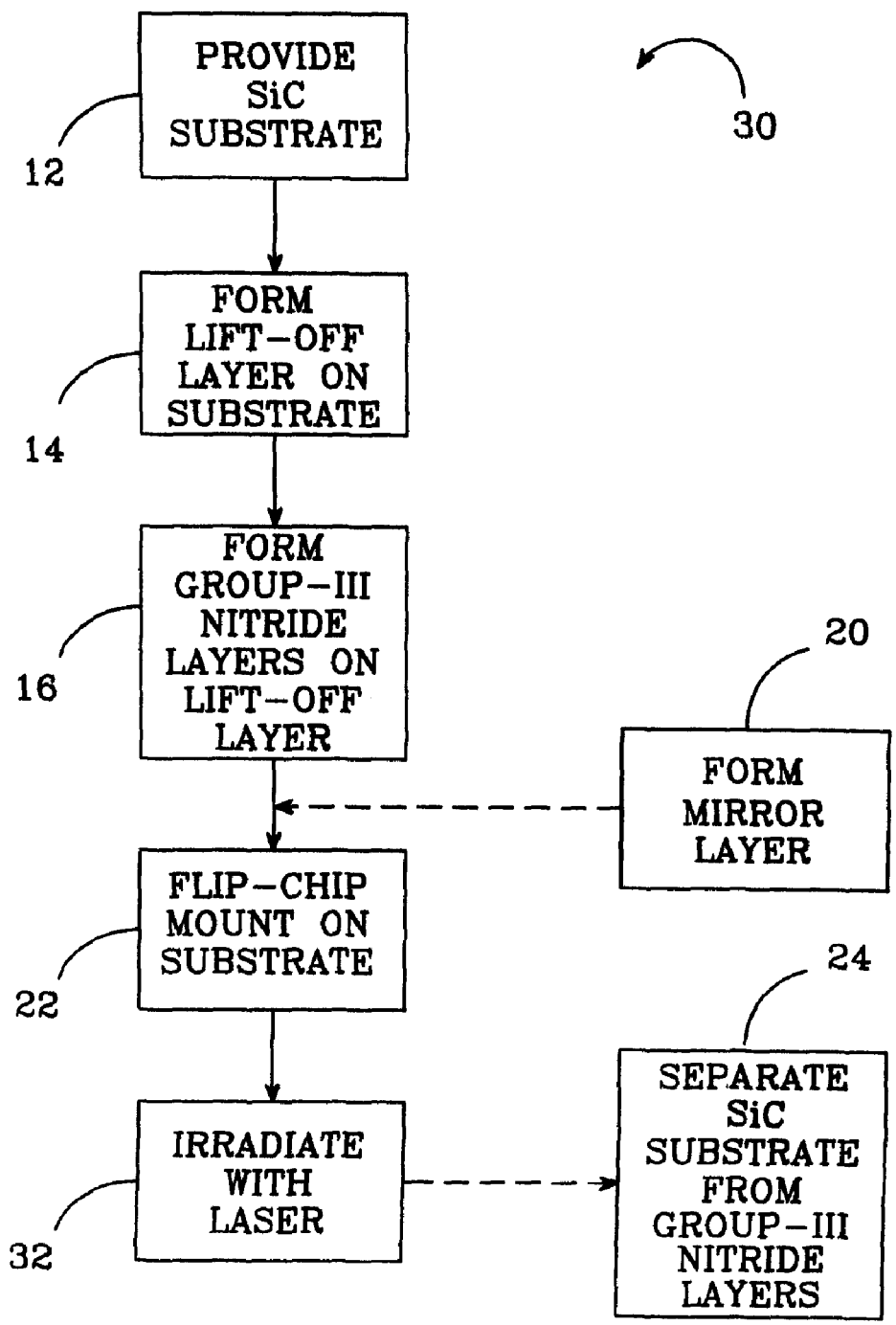
FIG. 2 is a flow diagram for another embodiment of a fabrication method according to the present invention.

FIG. 2 shows another embodiment of a method 30 according to the present invention for fabricating Group-III nitride semiconductors, with the method 30 also being particularly adapted for fabricating thin film Group-III nitride semiconductor devices formed on a silicon carbide (SiC) substrate. The method 30 comprises many similar steps as the method 10 and for the similar steps the same reference numerals will be used. In step 12 a SiC substrate is provided and in step 14 a lift-off layer is grown on at least one surface of the substrate, with the lift-off layer comprising AlGaN, AlInGaN, AlGaInAs, or other materials that react with laser irradiation as described below.

In step 16 epitaxial layer(s) are formed on the lift-off layer such that the lift-off layer is sandwiched between the substrate and epitaxial layer(s), with the epitaxial layer(s) preferably formed of GaN. In step 20, an optional first mirror layer can be formed and in step 22 the semiconductor device is flip-chip mounted to a submount.

In method 30, the device is not exposed to a PEC etch to etch the lift-off layer, but instead, in step 32 the semiconductor device is illuminated by a laser. The laser should generate a wavelength of light that is not absorbed by the SiC substrate or GaN epitaxial layers, but is absorbed by the InGaN lift-off layer. SiC absorbs wavelengths of light of approximately 390 nm and less, GaN absorbs wavelengths of light of approximately 360 nm or less, and InGaN absorbs wavelengths of light of approximately 450 nm or less. The laser irradiation according to the present invention should have a wavelength between approximately 390 and 450 nm, with a suitable wavelength being 400 nm. The SiC substrate and GaN layers are transparent to laser irradiation of this wavelength and when the irradiation strikes the lift-off layer, the light is absorbed. This causes the liftoff layer to heat up and dissipate, allowing the epitaxial layers and submount to separate. It should be understood that many other wavelengths of laser irradiation can be used between approximately 390 and 450 nm.

In alternative step 24, a second mirror can be deposited on the surface of the epitaxial layer(s) that is revealed by separating the SiC substrate from the epitaxial layer(s). As discussed above in FIG. 1, this step is usually included when fabricating a RCLED, solid state laser, or VCSEL.

Figure 3:
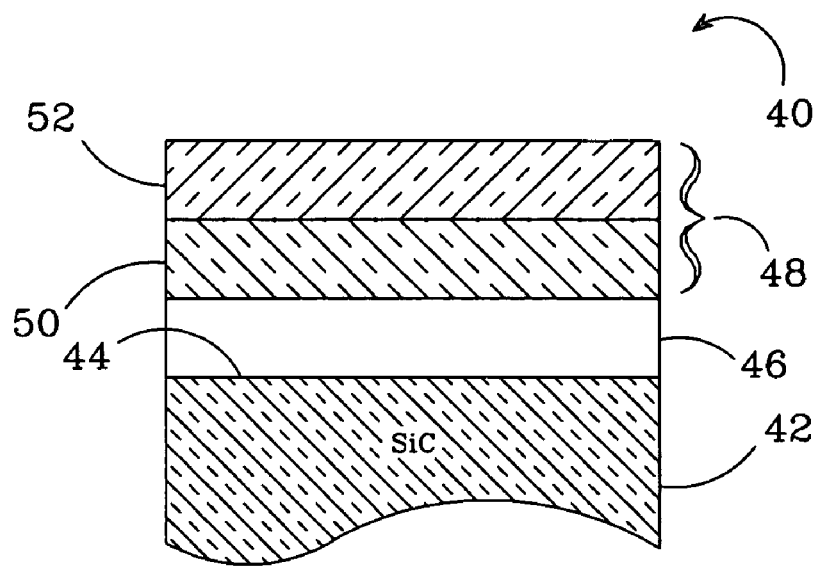
FIG. 3 is a sectional view of one embodiment of a semiconductor device according to the present invention at one of the intermediate steps of the methods in FIGS. 1 and 2.

Many different devices can be fabricated using the methods 10, 30 of FIGS. 1 and 2. FIG. 3 shows one embodiment of a LED 40 according to the present invention that can be fabricated using the methods 10, 30, with the LED 40 shown at one of the intermediate fabrication steps. The LED 40 comprises a silicon carbide substrate 42 that is used to anchor the epitaxial growth and has a first substrate surface 44 upon which the lift-off layer 46 is formed. The lift-off layer 46 can comprise the materials described above in methods 10 and 30 shown in FIGS. 1 and 2 respectively. The epitaxial device layer structure 48 is then fabricated on the lift-off layer 46, with the lift off layer 46 sandwiched between the substrate 42 and the epitaxial structure 48. In this embodiment epitaxial device 48 comprises an n-type GaN layer 50 that is grown directly on the lift-off layer 46 and a p-type GaN layer 52 that is grown on top of n-type layer 50. In other embodiments, an active region can be included between the n-type and p-type layers 50, 52. The n-type and p-type layers 50, 52 can have many different thicknesses depending on the device being fabricated. The lift-off layer 46 can also have many different thicknesses with a suitable thickness being in the range of approximately 1000-2000 angstroms. When using the PEC etch of FIG. 1, if the lift-off layer 46 is below 1000 angstroms thick the meniscus effect can slow down the removal of the lift-off layer as the removal process moves toward the center of the device.

Figure 4:
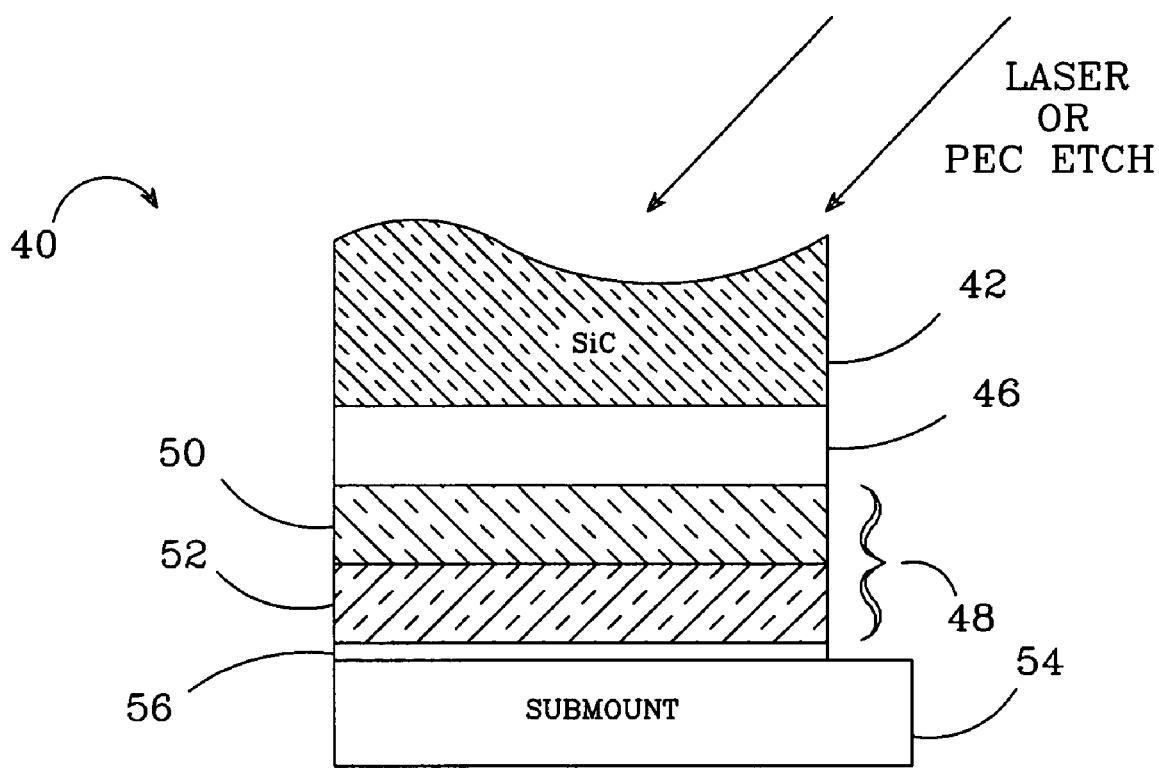
FIG. 4 is a sectional view of the semiconductor device in FIG. 3 at another of the intermediate steps of the methods in FIGS. 1 and 2.

FIG. 4 shows the LED 40 of FIG. 3 after it is flip-chip mounted to a submount 54 by a bonding layer/material 56 top surface of the epitaxial structure adjacent to the submount 54. In one embodiment according to the invention the bonding layer/material 56 is an epoxy material comprising silver tin eutectic. As described above, submount 54 can be one of many structural members including silicon, silicon carbide, sapphire, glass or metals and can also contain drive electronics or electrostatic discharge protection elements.

Figure 5:
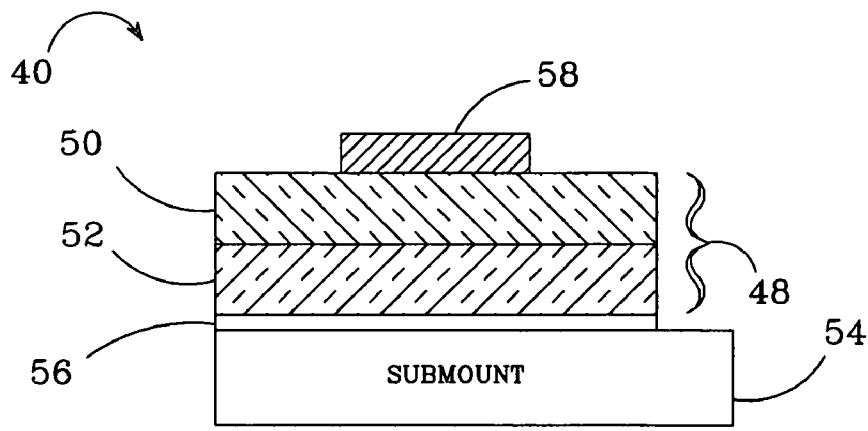
FIG. 5 is a sectional view of the semiconductor device in FIG. 4 at another of the intermediate steps of the methods in FIGS. 1 and 2.

Once mounted to the submount 54, the LED 40 is exposed to a PEC etch of the type described under step 22 of the method 10 in FIG. 1, or a laser illumination of the type described in step 32 of the method 30 in FIG. 2. This causes the substrate 42 to separate from the epitaxial structure 46. FIG. 5 shows the LED 40 after its substrate has been removed and a contact 58 has been deposited on the top surface. In this embodiment, the submount 54 can be conductive such that a bias can be applied to the epitaxial structure 48 across the submount 54 and the contact 58.

Figure 6:
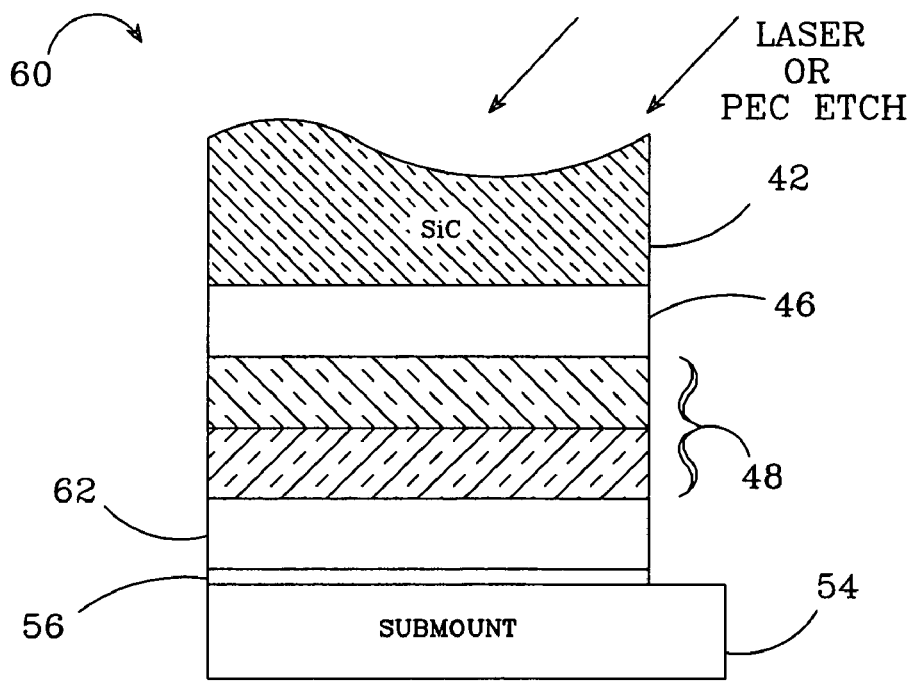
FIG. 6 is a sectional view of another embodiment of a semiconductor device according to the present invention at one of the intermediate steps of the methods in FIGS. 1 and 2.

FIG. 6 shows one embodiment of a LED 60 according to the present invention that can be fabricated using the methods 10, 30, with the LED 60 shown at one of the intermediate fabrication steps. The LED 60 comprises many similar features as the LED 40 in FIGS. 3-5 and for these similar features the same reference numerals will be used. The LED 60 comprises a SiC substrate 42, a lift-off layer 46, an epitaxial structure 48, all of which are flip chip mounted on a submount 54 by a bonding layer/material 56. In LED 60, however, a first mirror layer 62 is included between the epitaxial structure 48 and the submount 54. To achieve this arrangement, the first mirror layer 62 can either be formed on the submount 54 or the epitaxial structure 48 before flip-chip mounting. In the embodiment shown, the mirror layer is formed on the epitaxial structure 48 before flip chip mounting so that the bonding layer/material is between the first mirror 62 and submount 54.

Figure 7:
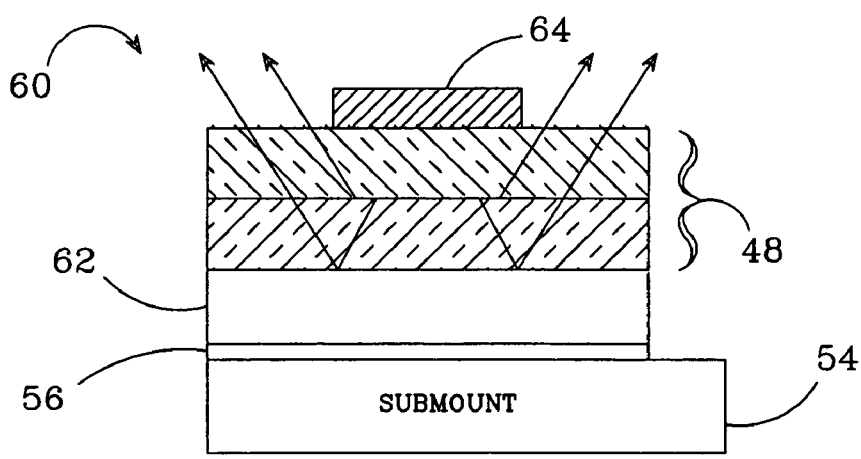
FIG. 7 is a sectional view of the semiconductor device in FIG. 6 at one of the intermediate steps of the methods in FIGS. 1 ands 2.

The LED 60 can then be exposed to a PEC etch of the type described under step 22 of the method 10 in FIG. 1, or a laser illumination of the type described in step 32 of the method 30 in FIG. 2. This causes the substrate 42 to separate from the epitaxial structure 48. FIG. 7 shows the LED 60 after the substrate has been separated from the epitaxial structure 48 and a contact 64 has been deposited on the exposed surface of the epitaxial structure 48. A bias can be applied to the epitaxial structure 48 across the contact 64 and the submount 54 of first mirror 62 to cause the epitaxial structure 48 to emit light in all directions. Light that is directed toward the first mirror layer 62 is reflected back toward the top surface of the epitaxial structure 48 where it can contribute to light emitting from the LED 60.

Different embodiments of a resonant cavity light emitting diode (RCLED) can also be using methods 10 and 30 in FIGS. 1 and 2. As described above, RCLEDs typically comprise epitaxial layers that are much thinner than typical LEDs. RCLEDs typically comprise two oppositely doped epitaxial layers and mirrors on the oppositely doped layers such that the oppositely doped layers are sandwiched between the mirrors. One of the mirrors has reflectivity that is lower than the reflectivity of the other mirror so that light exits the RCLED through the lower reflectivity mirror. A resonant cavity effect appears when the thickness of the epitaxial layers is approximately one wavelength of the light generated by the epitaxial layers. The methods 10 and 30 are particularly adapted to forming epitaxial structures with thin layers appropriate for RCLEDs.

Figure 8:
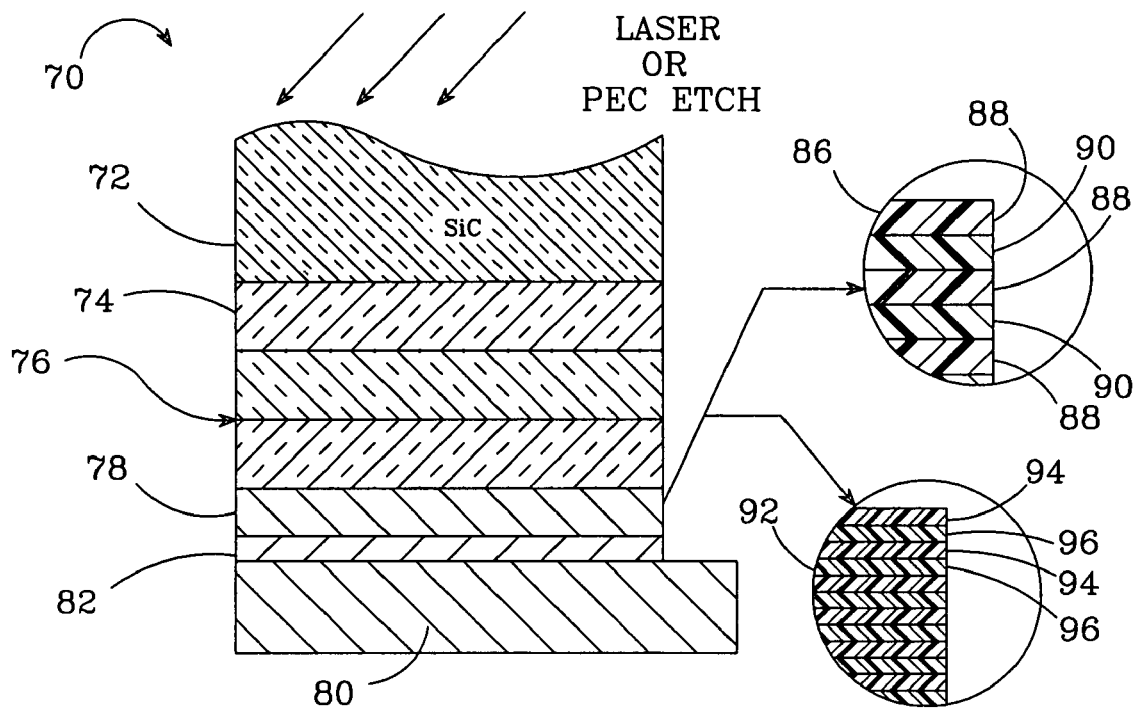
FIG. 8 is a sectional view of another embodiment of a semiconductor device according to the present invention at an intermediate step of the methods in FIGS. 1 and 2.

FIG. 8 shows one embodiment of an RCLED 70 fabricated according to methods 10 and 30 at one of the intermediate fabrication steps. RCLED 70 comprises a SiC substrate 72, InGaN lift off layer 74 and a GaN epitaxial structure 76 having thin epitaxial layers. A first mirror layer 78 is included on the epitaxial structure, with the entire RCLED 70 flip-chip mounted on a submount 80 by a bonding layer/material 82 such as an epoxy material comprising silver tin eutectic. As described above, submount can be one of many structural members including silicon, silicon carbide, sapphire, glass or metals, and can include drive/protection electronics. The RCLED 70 can then be exposed to a PEC etch of the type described under step 22 of the method 10 in FIG. 1, or a laser illumination of the type described in step 32 of the method 30 in FIG. 2. This causes the substrate 72 to separate from the epitaxial structure 76.

Many different materials and structures can be used for the first mirror layer 78. In the embodiment shown in FIG. 8 the first mirror layer 78 comprises a p-type metal mirror 84 that can be made of silver, gold, rhodium, platinum, palladium or gold tin or combinations thereof.

In another embodiment according to the present invention the first mirror 78 can comprise a DBR having many made of many different layer pairs having different thicknesses and different indexes of refraction. One embodiment comprises a dielectric DBR first mirror 86 preferably made of alternating dielectric layers of quarter wavelength thicknesses p-type silicon dioxide 88 and p-type titanium oxide 90. Another embodiment of the DBR first mirror 86 according to the present invention can comprise alternating dielectric layers of silicon dioxide and tantalum pentoxide. The contrast in indexes of refraction between epitaxial structure 76 made of GaN and layers 88, 90 that form DBR first mirror 86 is sufficient that the DBR first mirror 86 effectively reflects light with two to four alternating layer pairs, with a suitable number of alternating layer pairs being three. It is also understood that a DBR first mirror 86 with fewer or more pairs can be used. The thickness of these layers corresponds to a quarter wavelength of light generated by the epitaxial device structure 76 when a bias is applied across it.

Another embodiment comprises an epitaxial DBR first mirror 92 comprising alternating pairs of an epitaxial material. Many different alternating pairs can be used, with the DBR first mirror 92 preferably comprising alternating pairs of p-type GaN 94 and p-type aluminum nitride 96. In other embodiments of the epitaxial DBR first mirror 92, aluminum alloy nitride can be used instead of aluminum nitride. The index of refraction difference between epitaxial device structure 76 and the material that comprises epitaxial DBR first mirror 92 is such that the mirror 92 requires approximately eight to twelve layer pairs that are approximately a quarter wavelength thick, with a suitable number of layer pairs being ten. It is understood that the DBR will also work with fewer and more layer pairs.

Figure 9:
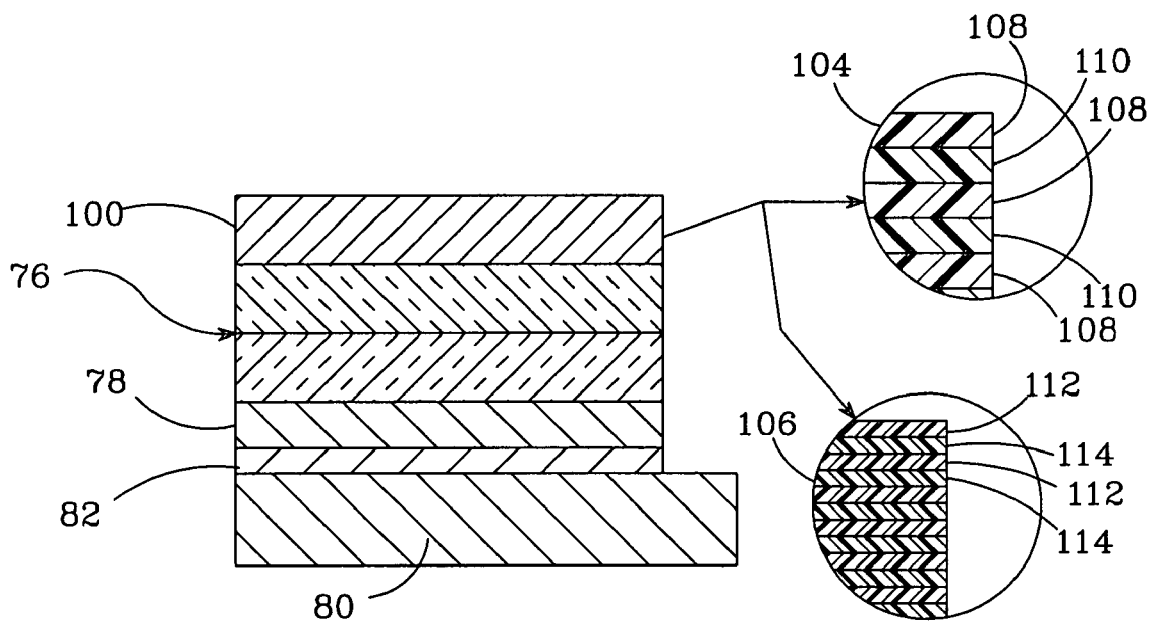
FIG. 9 is sectional view of the semiconductor device in FIG. 8 after etching off the substrate and depositing a second mirror according to the methods of FIG. 1 and 2.

FIG. 9 shows one embodiment on the RCDLED 70 of FIG. 8 with the substrate removed and a second mirror layer 100 on the exposed surface of the epitaxial structure after the substrate is removed. Like the first mirror layer 78, the second mirror layer 100 can be many different mirror types such as an n-type metal mirror (as shown), an n-type dielectric DBR 104 or an n-type epitaxial DBR 106. The n-type metal mirror can comprise silver, gold, rhodium, platinum, palladium or gold tin or combinations thereof. The n-type dielectric DBR 104 can be made of many different alternating pairs, but is preferably made of approximately three alternating pairs of a silicon dioxide layer 108 and a titanium dioxide 110. N-type epitaxial DBR 106 can comprise approximately ten pairs of n-type GaN 112 and n-type aluminum nitride 114.

The second mirror layer 100, however, should have a lower reflectivity than the first mirror 78 so that light exits the RCLED through the second mirror layer 100. A metallization layer (not shown) can also be deposited on the exposed surface of second mirror n-type layer 100 and can be any of gold, silver, rhodium, palladium, platinum or gold tin for bonding.

Figure 10:
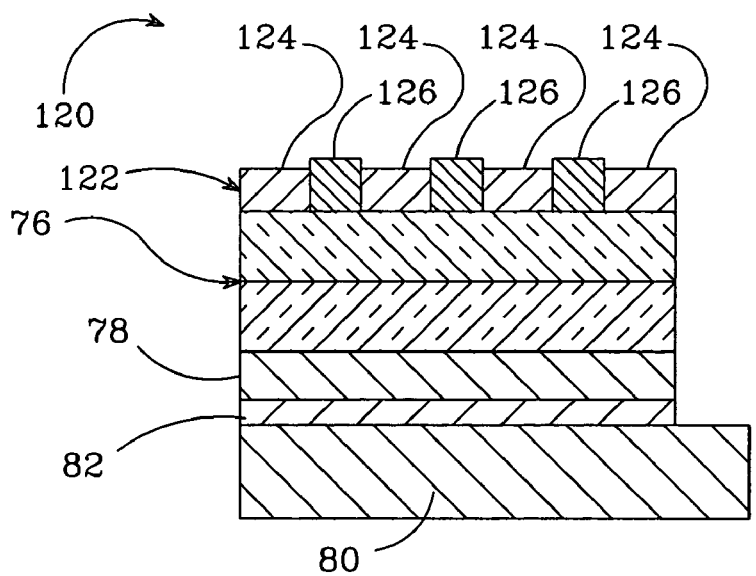
FIG. 10 is a sectional view of the semiconductor device in FIG. 9, with a DBR and wire mesh second mirror.
Figure 11:
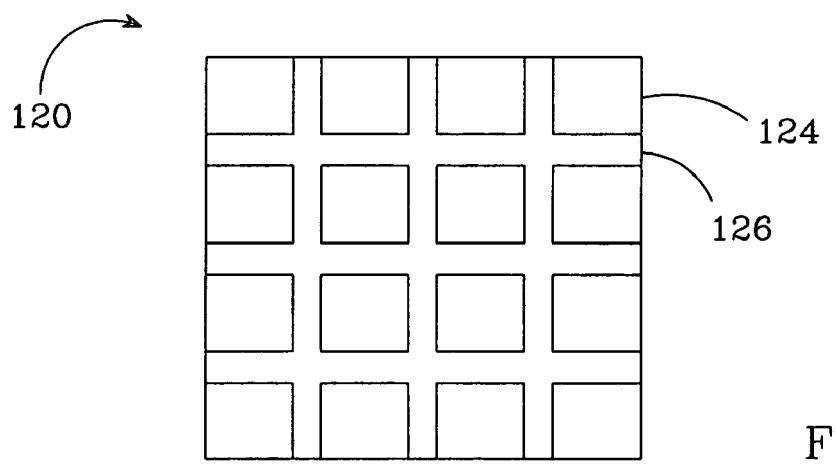
FIG. 11 is a plan view of the semiconductor device shown in FIG. 10.

FIGS. 10 and 11 show a RCLED 120 that comprises the RCLED 70 in FIG. 8 with the substrate removed and a second mirror layer that combines DBR second first mirror with a metal mirror to enhance current spreading into the epitaxial structure 76, with the second mirror 122 comprising a DBR 124 with a metal mesh 126 to spread current from a contact. The DBR 124 is deposited on epitaxial structure 76 with a sufficient number of layers of appropriate thickness to be highly reflective. Channels are then opened in the DBR 124, usually by etching, which extend across the surface of the epitaxial structure and are interconnected. These channels are then filled with metal mirror material to form the metal mesh 126. DBR 124 has a higher reflectivity compared to the metal 126, but the combination of a metal mesh 126 and DBR 124 comprises a layer with sufficient reflectivity and good current spreading. FIG. 11 is a top plan view of RCLED 120 showing the top surface of the DBR 124 and metal mesh 126. The metal mesh 126 is shown as orthogonal and interconnected channels, although the mesh can have many different channel arrangements. It is also understood that the first mirror layer 78 can also have this DBR and metal mesh arrangement to enhance current spreading.

FIGS. 12-15 show different embodiments of an LED according to the present invention that can be fabricated using the method 10 and 30 in FIGS. 1 and 2. In each of the RCLEDs shown, the first mirror layer can be any of the metal mirror deposition, the p-type DBR, or the p-type epitaxial DBR. Similarly, in each of the RCLEDs that second mirror layer can be an n-type metal mirror, n-type DBR, or n-type epitaxial DBR. In these figures the selection of the second mirror layer is not constrained by the selection of the first mirror layer and vice versa. For example, second mirror layer can be an n-type metal mirror when first mirror layer is a p-type DBR in embodiments where the p and n-type layers are reversed.

Figure 12:
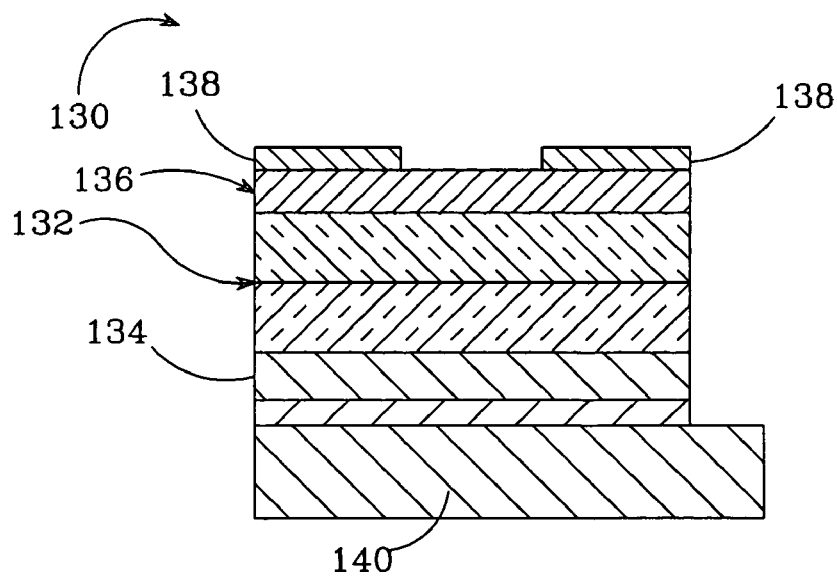
FIG. 12 is a sectional view of another embodiment of a semiconductor device according to the present invention fabricated pursuant to the methods in FIGS. 1 and 2.

FIG. 12 shows one embodiment of an RCLED 130 according to the present invention that can be fabricated using the methods 10 and 30. As described above, RCLEDs require that the epitaxial structure 132 be thin, having a thickness of approximately one wavelength of the light being emitted by the structure 132. The methods 10 and 30 provides for the fabrication of high quality Group-III nitride thin layers particularly adapted to RCLEDs. The first and second mirror layers 134, 136 can be any of those described above and the RCLED 130 also comprises a contact metal layer 138 on the second mirror layer 136. The bottom layer of the epitaxial structure 132 can be contacted through the submount 140 such that the RCLED 130 emits light in response to a bias applied across the submount 140 and the contact metal layer 138.

Figure 13:
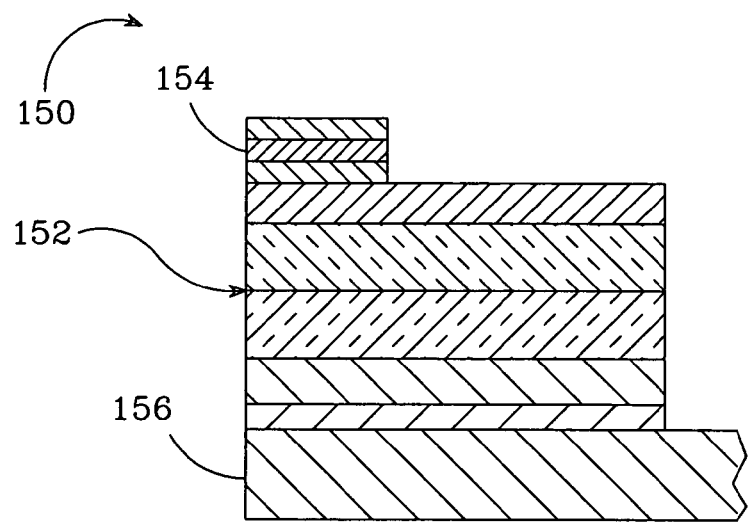
FIG. 13 is a sectional view of another embodiment of a semiconductor device according to the present invention fabricated pursuant to the methods in FIGS. 1 and 2.

The methods 10 and 30 can also be used in the fabrication of devices having epitaxial layers that are thicker than those in RCLEDs. FIG. 13 shows one embodiment of a standard LED 150 according to the present invention that can be fabricated by the methods 10 and 30. The epitaxial structure 152 has dimensions significantly larger than those of an RCLED epitaxial structure. The LED 150 also has a contact 154 to provide a current to one of the oppositely doped layers in the structure 152, with the other of the oppositely doped layers contacted through the submount 156.

Figure 14:
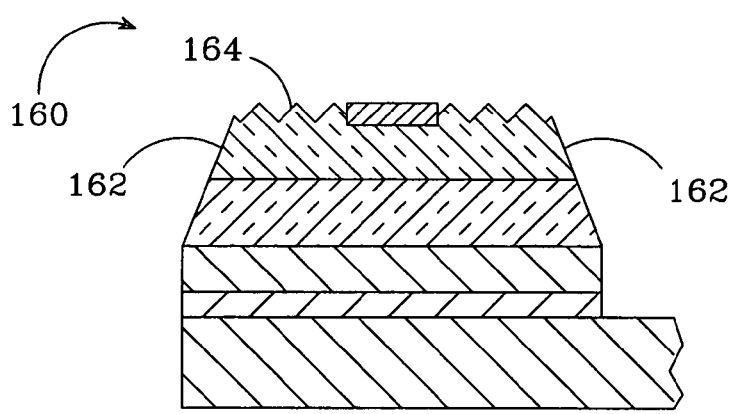
FIG. 14 is a sectional view of another embodiment of a semiconductor device according to the present invention fabricated pursuant to the methods in FIGS. 1 and 2.

The method 10 can also be used in fabricating epitaxial devices that have other features to enhance light extraction. FIG. 14 shows an embodiment of LED 160 having shaped side surfaces 162 and is roughened on its primary emitting surface 164. The LED 160 is typically shaped and roughened after the substrate removal methods 10 and 30 are complete. Shaping and roughening the LED 160 increases the light extraction of the LED 160 by increasing the fraction of light that hits the surface and escapes to emit light from the device.

Figure 15:
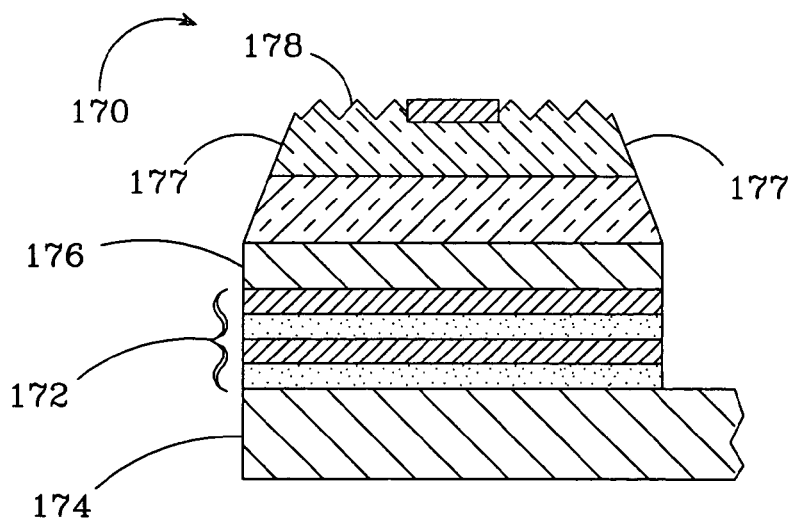
FIG. 15 is a sectional view of another embodiment of a semiconductor device according to the present invention fabricated pursuant to the methods in FIGS. 1 and 2.

All of the devices described herein can also be fabricated with additional layers and features, one of them being a structure to protect the device from electro-static discharge (ESD). FIG. 15 shows an LED 170 that is similar to the LED 160 of FIG. 14, but includes a Zener diode 172 arranged between the submount 174 and the first mirror layer 176. The sneer diode 172 is integrated in the submount 174 during fabrication of the submount 174 and constrains the flow of current through the LED to one direction only. The LED shown also has angled side surfaces 177 and a roughened emitting surface 178. When fabricating LED 170 using the methods 10 and 30, the submount 174 is provided with the zener diode structure 172, such that when the device is flip-chip mounted on the submount 174 the zener diode structure 172 is integral with the device. The resulting structure provides high light extraction efficiency and high ESD rating. It is understood that the zener diode structure can be included in many different devices according to the present invention, including the different embodiments of the RCLEDs described above as well as vertical cavity surface emitting lasers and laser diodes.

Figure 16:
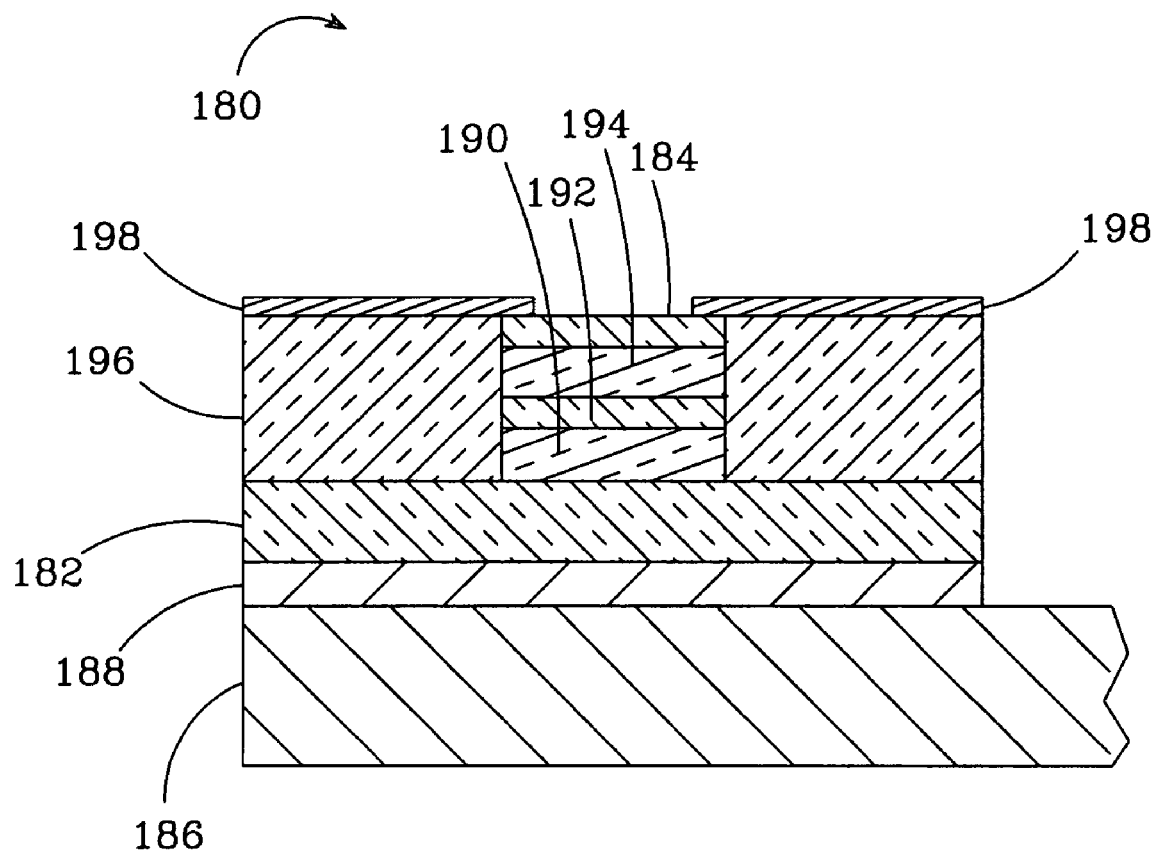
FIG. 16 is a sectional view of another embodiment of a semiconductor device according to the present invention at fabricated pursuant to the methods in FIGS. 1 and 2.

The methods 10 and 30 can also be used to fabricate other devises such as a vertical cavity surface emitting laser (VCSEL). FIG. 16 shows one embodiment of a VCSEL 180 according to the present invention fabricated by the methods 10 and 30. In this embodiment the first and second mirror layers surfaces 182, 184 are DBRs. First DBR mirror 182 is shown adhered to submount 186 by an epoxy epoxy/metallization 188. The quantum well structure of this embodiment is a single quantum well having a lower cladding layer 190 that can be fabricated from aluminum indium gallium nitride (AlInGaN). Quantum well 192 is arranged above lower cladding layer 190, and the quantum well 192 can be fabricated, in one example, from indium gallium nitride. Upper cladding layer 194 is arranged above the quantum well 192, such that the quantum well 192 is sandwiched between the upper and lower cladding layers 194, 190. Upper cladding layer 194 can be fabricated from aluminum gallium nitride.

The second DBR mirror layer 184 is deposited on top of upper cladding layer 194. This structure may be etched away to form isolated columns that can be round or rectangular. These isolated columns may then be further isolated by isolation epitaxial growth 196. In one embodiment the isolation material may be ion implanted. Implantation may damage the crystalline structure between the cells which would require annealing. The device is capped off with metallization 198. Metallization uses isolation structures for support but since the isolation structure does not conduct electricity the metallizations must at least partially contact mirror 184.

Although the present invention has been described in considerable detail with reference to certain preferred configurations thereof, other versions are possible. The methods according to the present invention can be used to fabricate many different devices and the devices described above can have many different layer arrangements. Therefore, the spirit and scope of the appended claims should not be limited to the preferred versions in the specification.

We claim:

1. A method for fabricating a high light extraction photonic device, comprising:

growing a lift-off layer on a substrate, wherein said lift-off layer comprises a material from the group InGaN, AlInGaN and AlInGaAs;

providing an epitaxial semiconductor device structure on said lift-off layer by growing thin doped layers suitable for a resonant cavity light emitting diode, comprising growing a first epitaxial semiconductor layer on said substrate and growing a second epitaxial semiconductor layer on said first epitaxial semiconductor layer, such that said first semiconductor layer is sandwiched between said lift-off layer and said second semiconductor layer, wherein said lift-off layer is sandwiched between said device structure and substrate, said epitaxial semiconductor structure comprising an emitter adapted to emit light in response to a bias;

flip-chip mounting said device structure, lift-off layer and substrate on a submount such that said epitaxial semiconductor device structure is sandwiched between said submount and said lift-off layer, and separating said substrate from said device structure.

2. A method for removing a silicon carbide substrate from a Group-III nitride epitaxial semiconductor material, comprising:

growing a lift-off layer on a SiC substrate, wherein said lift-off layer comprises a material from the group InGaN, AlInGaN and AlInGaAs;

growing a GaN epitaxial semiconductor device structure on said lift-off layer such that said lift-off layer is sandwiched between said device structure and substrate, said epitaxial semiconductor device structure comprising an emitter adapted to emit light in response to a bias;

flip-chip mounting said device structure, light-off layer and substrate on a submount such that said epitaxial semiconductor device structure is sandwiched between said submount and said lift-off layer; and removing said lift-off layer using a photo electrochemical etch, to separate said substrate from said device structure.

3. The method of claim 2, wherein said photo electrochemical etch comprises a solution of KOH and water and a light source having an approximate 400 nanometer (nm) wavelength.

4. A method for removing a silicon carbide substrate from a Group-III nitride epitaxial semiconductor material, comprising:

growing a lift-off layer on a SiC substrate wherein said lift-off layer comprises a material from the group InGaN, AlInGaN and AlInGaAs;

growing a GaN epitaxial semiconductor device structure on said lift-off layer such that said lift-off layer is sandwiched between said device structure and substrate, said epitaxial semiconductor device structure comprising an emitter adapted to emit light in response to a bias;

flip-chip mounting said device structure, lift-off layer and substrate on a submount such that said epitaxial semiconductor device structure is sandwiched between said submount and said lift-off layer; and removing said lift-off layer by illuminating said lift-off layer with a laser light, to separate said substrate from said device structure.

5. The method of claim 4, wherein said laser light has a wavelength in the range of approximately 390 and 450 nm.

6. A method for fabricating a high light extraction photonic device, comprising:

growing a lift-off layer on a substrate, wherein said lift-off layer comprises a material from the group InGaN, AlInGaN and AlInGaAs;

providing an epitaxial semiconductor device structure on said lift-off layer such that said lift-off layer is sandwiched between said device structure and substrate, said epitaxial semiconductor structure comprising an emitter adapted to emit light in response to a bias;

flip-chip mounting said device structure, lift-off layer and substrate on a submount such that said epitaxial semiconductor device structure is sandwiched between said submount and said lift-off layer, and separating said substrate from said device structure by removing said lift-off layer.

7. The method of claim 6, wherein said lift-off layer comprises a material having a smaller band gap than said substrate and said epitaxial semiconductor device structure.

8. The method of claim 6, wherein removing said lift-off layer comprises exposing said lift-off layer to a photo electrochemical etch.

9. The method of claim 6, wherein removing said lift-off layer comprises exposing said lift-off layer to a solution and applying a light source, the combination of said solution and light source causing said lift-off layer to etch without etching the surrounding materials.

10. The method of claim 9, wherein said solution comprises KOH and water and said light source has an approximate 400 nanometer (nm) wavelength.

11. The method of claim 6, wherein removing said lift-off layer comprises applying a laser light source to said device that is transparent to said substrate and epitaxial structure, but is absorbed by said lift-off layer.

12. The method of claim 6, wherein said substrate comprises SiC, said epitaxial structure comprises GaN, wherein removing said lift-off layer comprises illuminating said device with laser light having a wavelength in the range of approximately 390 and 450 nm.

13. The method of claim 12, wherein said laser light has a wavelength of approximately 400 nm.

14. The method of claim 6, wherein said epitaxial semiconductor structure comprises a Group-III nitride semiconductor material.

15. The method of claim 6, wherein said substrate comprises monocrystaline silicon carbide (SiC).

16. The method of claim 6, wherein providing an epitaxial semiconducting structure comprises:

growing a first epitaxial semiconductor layer on said substrate, and growing a second epitaxial semiconductor layer on said first epitaxial semiconductor layer, such that said first semiconductor layer is sandwiched between said lift-off layer and said second semiconductor layer.

* * * * *